Dec. 18, 1962 J. B. VAN AUKER 3,069,560
PULSE AMPLIFIER WITH MEANS MAINTAINING CURRENT DRAIN CONSTANT IN DIFFERENT CONDUCTIVE STATES
Filed March 9, 1959
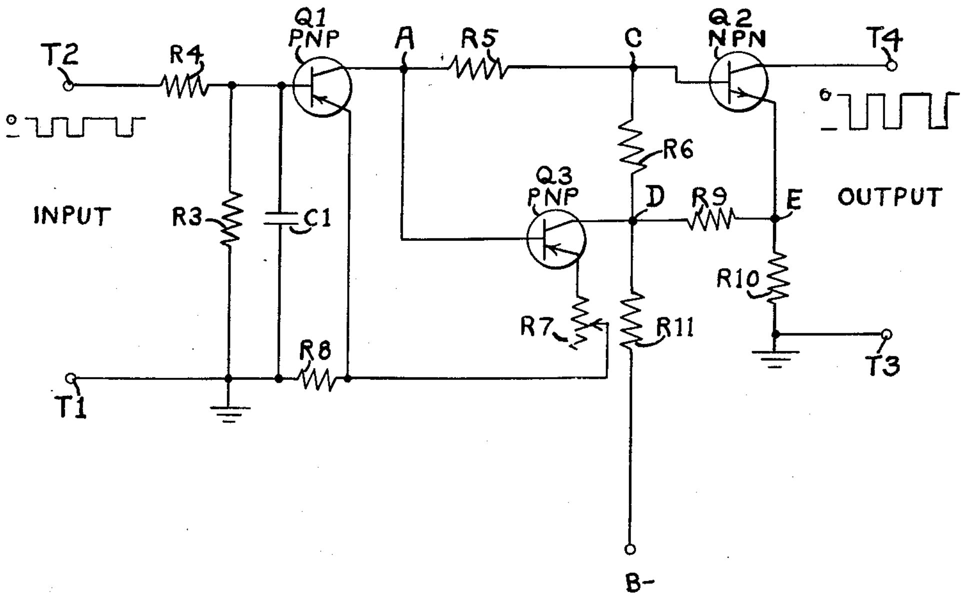
INVENTOR.
JOHN VAN AUKER
BY K. L. Miller
AGENT United States Patent Office 3,069,560

Patented Dec. 18, 1962

3,069,560

PULSE AMPLIFIER WITH MEANS MAINTAINING CURRENT DRAIN CONSTANT IN DIFFERENT CONDUCTIVE STATES

John Bertrand Van Auker, Southgate, Mich., assignor to Burroughs Corporation, Detroit, Mich., a corporation of Michigan Filed Mar. 9, 1959, Ser. No. 797,988
7 Claims. (Cl. 307—88.5)

This invention relates in general to transistor pulse code reproducers and more particularly to such devices having pulsed current inputs.

Prior art transistor pulse code reproducers have been suggested in which passage between stages is accomplished by means of capacitive coupling but such amplifiers are somewhat limited in low frequency response. Accordingly, an object of this invention is to provide an improved transistor pulse code reproducer using direct coupling in order to extend the low frequency response.

Another object of this invention is to provide a transistor pulse code reproducer capable of using a single power supply source for providing operating potential to the various direct coupled transistor stages. In prior systems of this type, various levels of well regulated potentials have been necessary to eliminate slow drifts of current flow which is negatived by this invention.

A still further object of this invention is to provide an arrangement whereby a plurality of low voltage transistors in a pulse code reproducer arrangement may utilize the same standard high voltage power supply generally adapted only for the higher voltage capacity vacuum tubes.

Another object of the invention is to provide a transistor pulse code reproducer which may be used with mark and space inputs without false signaling resulting from transient input noise signals.

A still further object of this invention is to provide a pulse code reproducer which will operate in spite of large amounts of distortion present in the mark or space input signals.

These and other objects of the invention will be more fully understood from the following detailed description of an illustrated embodiment thereof taken together with the accompanying drawing in which the single FIGURE shows a schematic diagram of a preferred embodiment of the invention.

Referring now to the single figure, input terminals T1 and T2 are adapted to receive mark and space signals developed across an input filter network including voltage divider resistors R4 and R3 with capacitor C1 connected in parallel across resistor R3. Terminal T1 is shown as connected to the common ground of the constant voltage power supply. The upper end of capacitor C1 is connected to the base terminal of input transistor Q1 which is illustrated as being a PNP junction transistor of common form. The emitter electrode of transistor Q1 is connected to ground through biasing resistor R8 with the bias provided in a manner hereinafter described. The collector electrode of transistor Q1 has its supply voltage provided through load resistors R5 and R6 which in turn are connected through dropping resistor R11 to the B minus terminal of a conventional power supply. The junction D between resistors R6 and R11 has a divided path, one leg of which includes resistors R9, junction E, and resistor R10, and the other leg of which includes the collector to emitter circuit of a second compensating transistor Q3 illustrated in the figure as being a PNP type transistor. The emitter of transistor Q3 completes its ground connection through potentiometer R7 and resistor R8. The junction C between resistors R5 and R6 is connected to the base of a third output transistor Q2 illustrated in the drawing as being an NPN transistor. The collector of transistor Q2 is connected to output terminal T4 and the emitter of transistor Q2 is connected to output terminal T3 through resistor R10. Typical mark and space signal inputs and outputs are illustrated in the figure adjacent their respective terminals.

Although the transistors Q1, Q2 and Q3 have been shown as a specific conductivity types it is expected that each transistor might be replaced with a transistor of its opposite conductivity type in a well-known manner by reversing the polarity of the voltages supplied thereto.

In operation explaining a sequence using exemplary voltages, when a mark signal is supplied to develop a negative potential at terminal T2 the potential is of proper polarity to cause transistor Q1 to turn on, thus providing current along its emitter to collector circuit. Current flow through transistor Q1 causes the base of transistor Q3 to be at approxmiately ground potential which tends to bias transistor Q3 to its cut-off condition. Load resistors R5 and R6 cause the current of transistor Q1 to limit at a value which is about 5 milliamps. The current flow causes junction C to have a potential of minus 6 volts and junction D to have a potential of minus 12 volts. The divider R9 and R10 causes junction E therefore to be about minus 11 volts. Since the base of transistor Q2 is thereby of the proper polarity, it causes collector current in transistor Q2 to the output load limited to approximately 13 milliamps. by resistor R9. Thus it may be seen that using these exemplary voltages a mark input causes transistors Q1 and Q2 to conduct and Q3 to be cut off with a total current drain on the power supply of approximately 18 milliamps.

When a space signal is applied across input terminals T1 and T2 transistor Q1 tends to turn off resulting in a negative potential being applied to the base of transistor Q3. This polarity is proper to cause conduction of transistor Q3 which develops an additional bias across resistor R8 tending to further turn off transistor Q1. Junction A therefore going more negative accelerates the current flow in the collector circuit of transistor Q3. This above described action causes rapid switching in response to input signals. Junction D using these exemplary voltages is maintained in the described embodiment at the same potential level of minus 12 volts and because transistor Q1 is effectively turned off junctions A, C and D are all at the same potential level. Junction E which is now slightly positive with respect to the base of transistor Q2 causes transistor Q2 to turn off. Transistor Q3 is provided with potentiometer R7 connected to its emitter electrode with a value of R7 chosen so that the collector current of Q3, with transistors Q1 and Q2 turned off, is equal to the combined collector currents of transistors Q1 and Q2 when they are turned on. Potentiometer R7 thus has a value which will cause Q3 to limit at 18 milliamps. in the collector circuit.

It may thus be seen in summary that during a mark input transistors Q1 and Q2 are conducting while transistor Q3 is turned off, whereas during a space input transistor Q3 is conducting while transistors Q1 and Q2 are turned off. The total current drain during each of these types of inputs is maintained constant. Accordingly, the voltage drop across resistor R11 is constant allowing for the use of a high voltage power supply while eliminating the possibility of damage to the transistors from an overvoltage condition.

In a constructed embodiment in accordance with the illustrated figure of the invention, the following values were used, and these are listed herein merely by way of example and not intended to limit the invention in any manner:

| | | |
|---|---|---|
| Resistor R4 | ohms | 2200 |
| Resistor R3 | do | 3900 |
| Resistor R5 and R6 | do | 1500 |
| Resistor R7 | do | 560 |
| Resistor R8 | do | 27 |
| Resistor R9 | do | 330 |
| Resistor R10 | do | 8200 |
| Resistor R11 | do | 12,000 |
| Capacitor C1 | microfarads | .01 |
| Transistor Q1 and Q3 | PNP, type | 2N369 |
| Transistor Q2 | NPN, type | 2N117 |
| Voltage B— | volts | 250 |

Having thus described the invention and its mode of operation, it is clear that certain modifications may be suggested to those skilled in the art which do not depart from the spirit or scope of the invention. Thus the invention is not to be limited to the described embodiment but only to the manner as defined by the appended claims.

What is claimed is:

1. In combination, at least first, second, and third transistors, each having a base, emitter, and collector electrode, a junction point common to each of said transistors, a single source of current supply connected through an impedance means to said junction point, said first and third transistors being of a like conductivity type and said second transistor being of an opposite conductivity type, means connected to said first transistor providing an input to said first transistor for selectively controlling emitter-collector current flow thereof to an "on" or "off" condition output means connected to said second transistor, means when said first transistor is in an "on" condition for maintaining said third transistor in an "off" condition, for maintaining said second transistor in an "on" condition, and for reversing the conditions of said second and third transistors when said first transistor is in an "off" condition, current limiting means maintaining the aggregate collector current of said first and second transistors in their "on" condition at a level substantially that of the collector current of said third transistor in its "on" condition, whereby said at least three transistors drain a constant amount of current from said source of current supply through said junction point in response to said selective input conditions.

2. A direct coupled transistor amplifier circuit for operating low voltage transistors from a high voltage source of supply comprising a high voltage source of supply, a voltage dropping resistor in series with said high voltage source, three parallel current paths each including a transistor, input means connected to a first of said transistors and output means connected to a second of said transistors, said parallel current paths being in series with said voltage dropping resistor, means responsive to said input means alternately for biasing one of said three transistors to cut-off while the remaining two transistors conduct a fixed amount and for biasing said two transistors to cut-off while said one of said three transistors conducts said same fixed amount, so that said voltage dropping resistor maintains a fixed low voltage to said three transistors.

3. A direct coupled transistor amplifier circuit as defined in claim 2 wherein said two transistors which are simultaneously conducting or biased to cut-off are of opposite conductivity type.

4. A transistor circuit comprising a single source of current supply, an input, an output, and a compensating transistor, each having an emitter, a base, and a collector electrode, said input transistor being of a first conductivity type and having load means in its emitter-collector circuit for limiting current therein to a first level, said output transistor being of a second conductivity type and having load means in its emitter-collector circuit for limiting current therein to a second level, said compensating transistor being of said first conductivity type and having load means in its emitter collector circuit for limiting current therein to a third level, an input circuit connected to said input transistor, means biasing said compensating transistor to conduct at said third level in response to an input signal which biases said input and output transistors to cut-off and, conversely, means biasing said input and output transistors to conduct at said first and second levels, respectively, in response to an input signal which biases said compensating transistor to cut-off, the sum of said first and second levels of conduction being equal to said third level of conduction to provide a constant drain of current from said source of supply in response to both of said input conditions.

5. In an arrangement for maintaining the voltage applied to a transistor amplifier constant, the combination comprising a first circuit including the emitter-collector current path of a first transistor of a first conductivity type, a second circuit including the emitter-collector current path of at least a second transistor of a second conductivity type, said first and second circuits being connected in parallel and having an input control means associated therewith for selectively causing a single of said current paths to be conducting while the remaining said path is non-conducting, said input control means having a single input terminal means providing "on" and "off" signals directly to said second circuit with further interconnecting means from said second to said first circuit for correspondingly controlling the conduction of said first transistor in response to said "on" and "off" signals, a voltage dropping resistor connected in series with said parallel circuits and a source of constant supply voltage connected across said series combination, load means connected to said first and second circuits including means limiting said current through said voltage dropping resistor to provide an unvarying level of voltage to said parallel circuits in response to said selective input control.

6. A switching circuit comprising at least a first, a second and a third transistor, each having a base, emitter and collector electrode, each of said transistors being connected in common emitter fashion, input means connected to the base-emitter circuit of said first transistor, direct coupling means from said first transistor to said second transistor, circuit means including said first transistor controlling the conduction state of said third transistor, a junction point common to each of said transistors, a high voltage source of supply connected to said junction point through a series impedance device, said first and third transistors being of one conductivity type and said second transistor being of an opposite conductivity type, adjusting means causing said third transistor to conduct at a current level equal to the combined current level of said first and second transistors, means responsive to said input causing said first and second transistors to turn to an "on" condition while said third transistor is in an "off" condition and causing said first and second transistors to turn to an "off" condition while said third transistor is in an "on" condition.

7. A switching circuit as defined in claim 6 wherein regenerative feedback means is provided from said third transistor to said first transistor causing a rapid change in the conduction state of said first transistor in response to an input signal.

References Cited in the file of this patent

UNITED STATES PATENTS

| | | |
|---|---|---|
| 2,751,550 | Chase | June 19, 1956 |
| 2,776,382 | Jensen | Jan. 1, 1957 |
| 2,801,296 | Blecher | July 30, 1957 |
| 2,891,146 | Sciurba | June 16, 1959 |
| 2,947,882 | Chou | Aug. 2, 1960 |